(12) United States Patent
Morris

(10) Patent No.: US 6,711,021 B1
(45) Date of Patent: Mar. 23, 2004

(54) SYSTEMS AND METHODS THAT USE AT LEAST ONE COMPONENT TO REMOVE THE HEAT GENERATED BY AT LEAST ONE OTHER COMPONENT

(75) Inventor: Terrel L. Morris, Garland, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/342,833

(22) Filed: Jan. 15, 2003

(51) Int. Cl.[7] .................................................. H05K 7/20
(52) U.S. Cl. ........................ 361/721; 361/690; 361/704; 361/719; 174/16.1; 165/80.2; 165/104.33
(58) Field of Search ................................ 361/687–690, 361/694, 695, 697, 703, 704, 707, 715–721, 784, 785, 790; 257/706, 707, 721, 722; 174/16.1, 16.3; 165/80.2, 80.3, 185

(56) References Cited

U.S. PATENT DOCUMENTS

| | | | | |
|---|---|---|---|---|
| 4,755,146 A | * | 7/1988 | Rishworth et al. | 439/71 |
| 5,198,965 A | * | 3/1993 | Curtis et al. | 361/717 |
| 5,208,729 A | * | 5/1993 | Cipolla et al. | 361/690 |
| 5,297,006 A | * | 3/1994 | Mizukoshi | 361/704 |
| 5,313,097 A | * | 5/1994 | Haj-Ali-Ahmadi et al. | 257/706 |
| 5,390,078 A | * | 2/1995 | Taylor | 361/721 |
| 5,861,666 A | * | 1/1999 | Bellaar | 257/686 |
| 5,986,882 A | * | 11/1999 | Ekrot et al. | 361/687 |
| 6,172,873 B1 | * | 1/2001 | Davis et al. | 361/716 |
| 6,262,890 B1 | * | 7/2001 | Dhawan et al. | 361/690 |
| 6,297,960 B1 | * | 10/2001 | Moden et al. | 361/719 |
| 6,421,240 B1 | * | 7/2002 | Patel | 361/699 |
| 6,424,532 B2 | | 7/2002 | Kawamura | |

* cited by examiner

Primary Examiner—Boris Chervinsky

(57) ABSTRACT

One embodiment of the invention is a system comprising a first component that generates heat, and a second component that is thermally connected to the first component, wherein the from the first component is transferred to a coolant through the second component, and the second component has a function in the computer system associated with an operation of the system other than transferring heat.

24 Claims, 4 Drawing Sheets

SYSTEMS AND METHODS THAT USE AT LEAST ONE COMPONENT TO REMOVE THE HEAT GENERATED BY AT LEAST ONE OTHER COMPONENT

FIELD OF THE INVENTION

Embodiments of this invention relate in general to electronic systems, and in specific to using at least one component to remove the heat generated by at least one other component.

DESCRIPTION OF RELATED ART

The electronic components that comprise computer systems generate heat as a byproduct of their operations. As the computer systems, and hence the components, become faster or otherwise increase their performance, the amount of heat that is generated tends to increase.

The prior art has addressed this problem by arranging the electronic components on the board in a dispersed manner. Air is then directed across the components. For example, FIG. 1 depicts a prior art layout for a computer board 10 having a plurality of components, namely four memory modules 11, two memory controller chips 12, a processor 13, and a plurality of surface mounted devices (SMDs) 14. Examples of SMDs are terminators, which are typically resistors and/or capacitors. The terminators are placed at the end of a bus.

The dispersed arrangement of the components allows air 15 to flow over the various components, and thus cool the components. Air 15 is typically forced air, more specifically air that is driven by a fan (not shown). Note that the board 10 may be mounted so that air flow 15 is in an upward, vertical direction, thus cooling is made more efficient by combining the convective force of heated air with the forced air from the fan.

For some components, e.g. processors, such an arrangement does not provided the required cooling. The prior art has attempted to solve this problem by attaching a cooling solution directly to the device. For example, a typical cooling solution is a heat sink 16, which comprises a metal block with fins that increases the surface area that is exposed to the air 15. Another example of a cooling solution is a small fan that would directly attach to the component and provide additional air flow across the component. Note that memory modules 11 may also have heat sinks coupled to them, as shown in U.S. Pat. No. 6,424,532, entitled "HEAT SINK AND MEMORY MODULE WITH HEAT SINK," filed Jul. 23, 2002, which is hereby incorporated herein by reference.

This may not work well for more densely packed systems. In many current systems, the components are placed very close to each other, and thus there is often not enough space between the components to allow for proper cooling. In addition to increasing the per unit area of heat generating components, the closer packing also tends to disrupt the flow of air. As shown in FIG. 1, the air 15 tends to flow in on one side of the board 10, flow across the components, and then flow out the other side of the board 10. Because of the spacing between the components, the air flow tends to be laminar. When the components are packed closer together, the air may not flow in a laminar manner, as various eddies and other flow disruptions may occur. These disruptions tend to reduce the cooling ability of the system.

BRIEF SUMMARY OF THE INVENTION

One embodiment of the invention is a system comprising a first component that generates heat, and a second component that is thermally connected to the first component, wherein the heat from the first component is transferred to a coolant through the second component, and the second component has a function in the computer system associated with an operation of the system other than transferring heat.

Another embodiment of the invention is a method for cooling a first component of a system that generates heat, comprising providing a second component in the system that has a function associated with an operation of the system other than transferring heat, thermally connecting the second component to the first component, whereby heat generated by the first component is transferred to the second component, and transferring heat from the second component to a coolant.

Another embodiment of the invention is a method for cooling a first component of a system, comprising generating heat by the first component, transferring heat from the first component to a second component in the system that has a function associated with an operation of the system other than transferring heat, and transferring heat from the second component to a coolant.

Another embodiment of the invention is a device for transferring heat from a system comprising a first portion for connecting a first component that has a function associated with an operation of the system other than transferring heat, a second portion for thermally connecting a second component that generates heat, a third portion for connecting the first portion to the system, thereby enabling the function of the first component, and a thermal conduction path between the first portion and the second portion, whereby heat from the second component can be transferred to the first component for dissipation to a coolant.

DETAILED DESCRIPTION OF THE INVENTION

Embodiments of the invention use one or more components ("the cooling components") as a cooling solution for one or more other components. The one or more cooling components are preferably thermally connected to the one or more other components. Thus, heat from the one or more other components flows to the one or more cooling components. Air (or other coolant) is passed over (and/or around and/or through) the one or more cooling components, which removes the heat generated by the one or more other components, as well as the heat generated by the one or more cooling components. Consequently, the one or more cooling components are functioning as cooling fins for the one or more other components. Moreover, since the one or more cooling components are removing the heat, the one or more other components do not need additional cooling solutions such as heat sinks or fans. Thus, the other components that would normally require heat sinks do not need heat sinks. Moreover, the components (cooling components and/or other components) are spaced more closely together to achieve desired cooling, in contrast with conventional wisdom.

The cooling component is preferably a memory module. However, the cooling component may also be any module or device with a similar form factor and/or intrinsic thermal properties and is mounted such that a relatively large surface area of the component is exposed to coolant (e.g. air). For example, I/O modules such as PCI cards, termination card modules, and low-power voltage regulator modules may be used as the at least one cooling components. Note that a group of cooling components may comprise different types of components or all of the same type of components.

The cooling components and the other components are preferably elements of a computer system. However, the components may comprise other types of systems, e.g. copy machines, printers, scanners, or any type of equipment that uses electronic components that generate heat.

A thermal connection may be provided according to embodiments of the invention by mounting the one or more memory modules on to the one or more components, thereby forming a stack. This arrangement will preferably use less area on the board, since some of the one or more memory modules that would have been coupled to the board are now coupled to the one or more components. In other words, a particular area of the board can be occupied by the one or more components plus some (or all) of the one or more memory modules. Thus, embodiments of the invention permit more functionality to be packed in less space.

Figure 2:
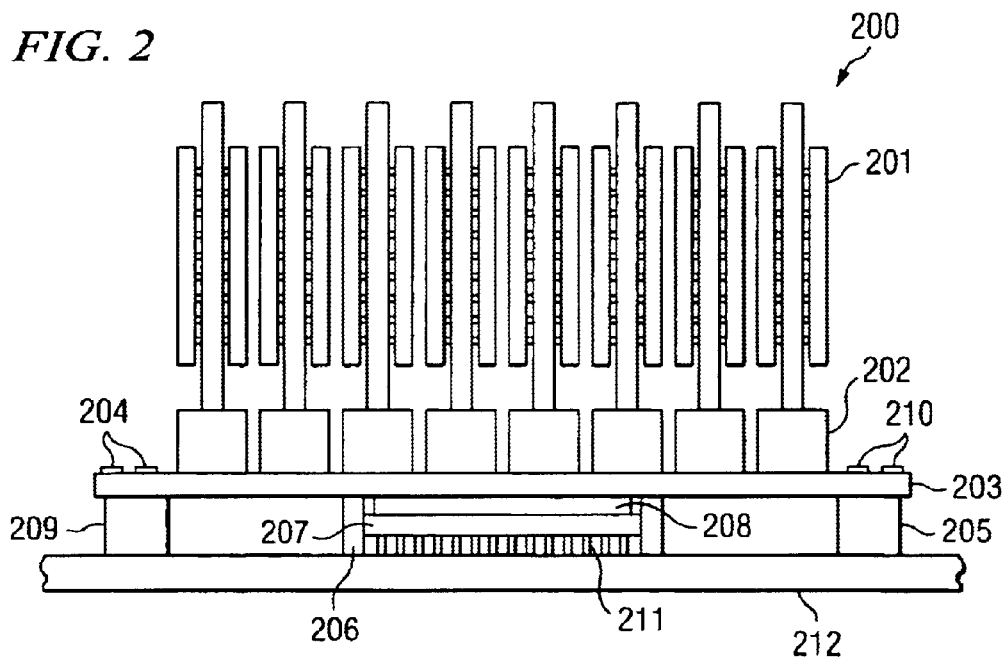
FIG. 2 depicts an example of an arrangement for using at least one component to cool at least one other component according to an embodiment of the invention.

FIG. 2 depicts an example of an arrangement 200 of a portion of a computer system according to one embodiment of the invention. The computer system preferably comprises a plurality of memory modules 201, a portion of which are shown in FIG. 2. The memory modules shown in FIG. 2 are dual-inline memory modules (DIMMs). However, the memory modules may be single-inline memory modules (SIMMs), read-only memory modules (ROMs), random access memory modules (RAMs), or any other type of memory that is mounted such that a large surface area is exposed to a coolant.

The memory modules 201 are connected to the memory board 203 by connectors 202. Typically, the connectors 202 are soldered or otherwise fixedly attached to the memory board 203, and the memory modules 201 are removably inserted into the connectors 202.

Memory board 203 is preferably connected to the system board 212 by at least one high speed connectors 205 or 209. However, more than one high speed connector may be used. These connectors also support the memory board 203 in addition to providing electrical connection with the system board 212. Connectors 205, 209 are preferably mezzanine connectors or vertical connectors that form sets of parallel interfaces, however, other types of connectors could be used. Thus, signals that need to be routed to the memory modules 201 would be routed from the system board 212, to either/both connectors 205, 209, to the memory board 203, and then to one or more memory modules 201, through one or more connectors 202. Similarly, signals routed from the memory modules 201 to the system board 212 would follow a reverse path.

Computer systems typically include a variety of devices in providing desired functionality. For example, surface mounted devices (SMDs) may be used with respect to memory modules 201 in the system. Such devices are typically mounted on the system board. Embodiments of the invention enable the surface mounted devices 204, 210 to be attached to the memory board 203. An example of SMDs are terminators, which are resistors and/or capacitors that are coupled to the end of a bus. Terminators prevent unwanted signal reflections on the buses by providing a known impedance at the end of the bus. Dual-data rate systems typically require terminators on the data buses. For example, a signal may be routed up through connector 209, to a destination in the memory modules 201, and be terminated at a SMD 210. Similarly, a signal may originate from board 212 and be routed up through connector 205, to a destination in the memory modules 201, and be terminated at a SMD 204. Note that other SMDs and/or terminators may be mounted on the system board 212.

Computer systems typically include a processor or controller 207 to manage operations or to perform a function. For example, system board 212 may comprise a memory array system board, whereby the controller 207 is a memory access controller, which manages the data flow into and out of the memory modules 201. Alternatively, system board 212 may comprise a main computer system board, whereby the controller 207 is a processor, which performs typical processor functions and uses the memory to store data for its operations. The controller may also be an I/O controller, cache chip, crossbar chip, or any integrated circuit package or packaged electrical function that requires a heat sink or other ancillary cooling device to provide thermal transfer beyond the limits of the intrinsic packaging of the packaged electrical function. For purposes of discussion, processor/controller 207 will be referred to as device 207. In any event, such a device 207 is typically attached to system board 212 by a ball grid array 211 or other type of connector (e.g. a socket).

The device 207 typically generates heat during its operation. Embodiments of the invention conduct the heat away from the device 207. For example, in the arrangement shown in FIG. 2, heat produced by device 207 is conducted to memory board 203, through the connectors 202, and into memory modules 201. Air or another coolant is directed across, around, and in between the memory modules 201. The large surface area (as compared to the surface area of the device 207) of the memory modules enables the heat to transfer from the memory modules to the coolant or air. Thus, the heat generated by the device 207, as well as any heat generated by the memory modules 201, is conducted away from the device 207 and the memory modules 201. A layer of conformal thermal transfer material 208 is preferably provided between device 207 and memory board 203. This layer enables good thermal transfer between irregular surfaces. Examples of such materials include those conformal thermal transfer materials produced by Chomerics, 3M, and Dow Corning. Other thermal transfer enhancements may be placed between device 207 and board 203, as needed, to insure heat transfer from the device 207 to the board 203, e.g. a block of heat conducting material (e.g. aluminum), a thermo-electric cooler, or a heat pipe.

Memory board 203, connectors 202, and memory modules 201 comprise thermal conducting materials that, at least, define a path for the flow of the heat. Such materials may include copper, beryllium copper, and other metals, and/or plastics. The thermal conducting path may include portions of the electrical operation paths, e.g. the power wires/planes, the ground wires/planes, connector pins and mating contact portions, board vias, and/or the data wires of these components 203, 202, 201. The thermal conducting path may include dedicated thermal transmission paths that are provided in these components 203, 202, 201. The thermal conducting path may also include other portions of the components 203, 202, 201, e.g. a portion of the component casing or EMI shielding materials applied to the components.

Note that the memory modules 201 may be standard memory modules, or they may be specifically constructed to include a cooling solution to enhance heat dissipation. For example, if the ground plane is used to transfer heat from the device, then the ground plane may be extended past the end of the memory module, and thereby allow the ground plane to directly contact the air. Also, another cooling solution such as heat dissipation elements (e.g. fins), may be formed on the memory modules to allow for more efficient heat transfer to the air. Additionally, other cooling solutions such as heat sinks or fans may be coupled to the memory modules.

Computer system 200 of the illustrated embodiment further comprises support 206. This support prevents forces that are applied to the memory board 203 during insertion of the memory modules 201 from impacting the device 207. The support transfers any such forces to the system board 212. This support may comprise a ring, circle, or other shape that encloses the device 207, or it may comprise one or more posts, pillars, or other support members that are placed to prevent the insertion forces from reaching the device 207.

Figure 4:
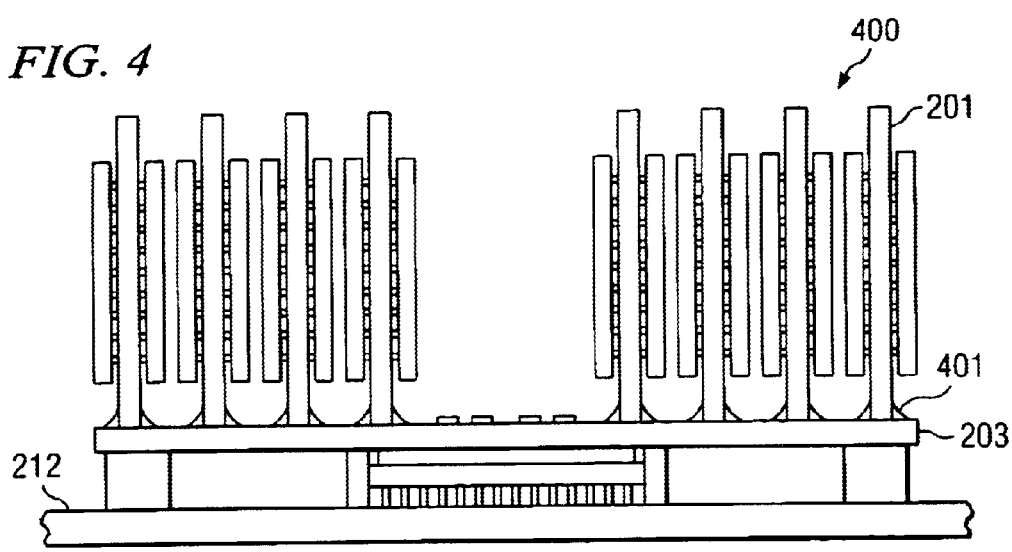
FIG. 4 depicts an example of an arrangement for using at least one component to cool at least one other component according to another embodiment of the invention.
Figure 5:
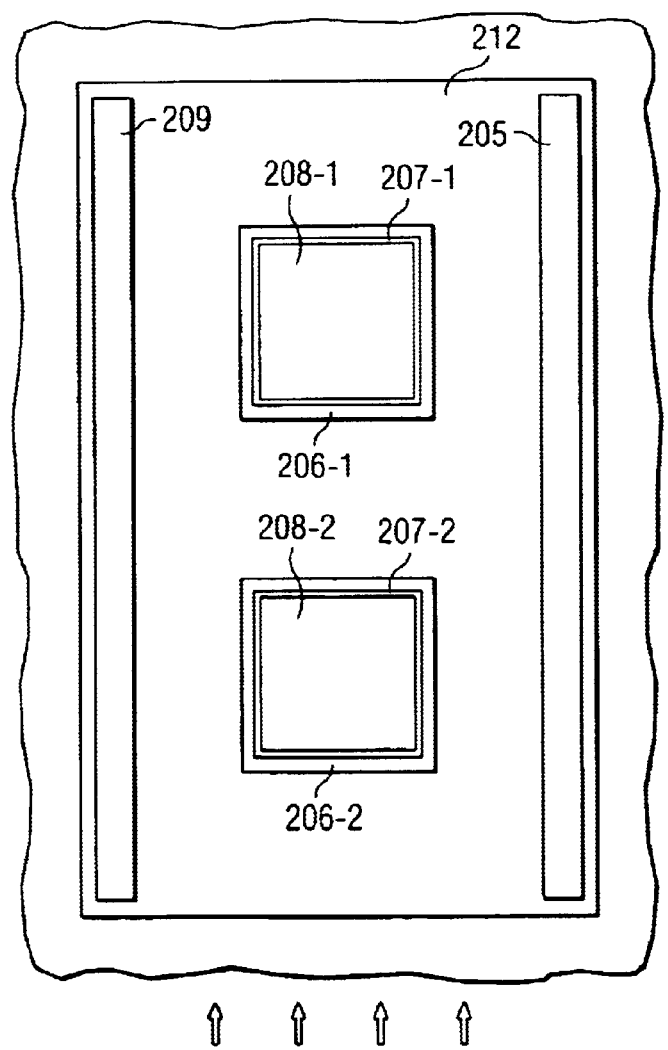
FIG. 5 depicts an example of an arrangement of components for use with the arrangements of FIGS. 2, 3A, 3B, and 4.

Support 206 preferably comprises an electromagnetic interference (EMI) shield. The shield may comprise a solid can that is connected to the ground plane of the system board 212 and/or the ground plane of the memory board 203. The shield may also comprise a solid ring or other shape that is connected to the ground planes of the system board 212 and the memory board 203. The shield may also comprise a can or ring or other shape that is perforated, wherein the perforations are selected to inhibit (EMI) at selected wavelengths, but will permit some passage of cooling air. Such a shield would reduce and/or eliminate EMI from coming inside the shield and/or from leaving the inside of the shield. FIG. 5 depicts a top view of two devices, namely 207-1 and 207-2, attached to system board 212. Note that each device is individually shielded by a respective support 206-1 and 206-2. Each device may include respective layer of conformal thermal transfer material 208-1, 208-2. The arrangement of FIG. 5 may also work with the arrangements shown in FIG. 3A–B and 4.

Note that number of memory modules shown in FIGS. 2, 3A–B, and 4 is by way of example only as fewer or more memory modules could be used. Moreover, additional memory modules may be located elsewhere in the system, e.g. located on board 212, and may not used for cooling purposes. Similarly, the number of devices 207 shown in FIGS. 2–5 is by way of example only as fewer or more devices could be cooled by embodiments of the invention.

Figure 3A:
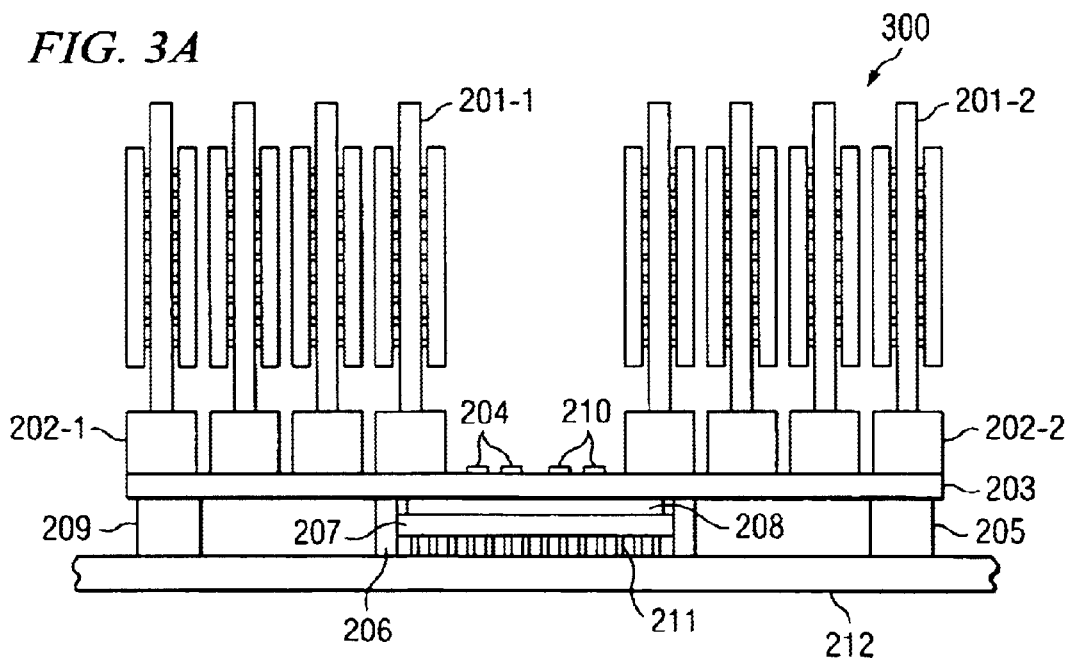
FIGS. 3A and 3B depict an example of an arrangement for using at least one component to cool at least one other component according to another embodiment of the invention.
Figure 3B:
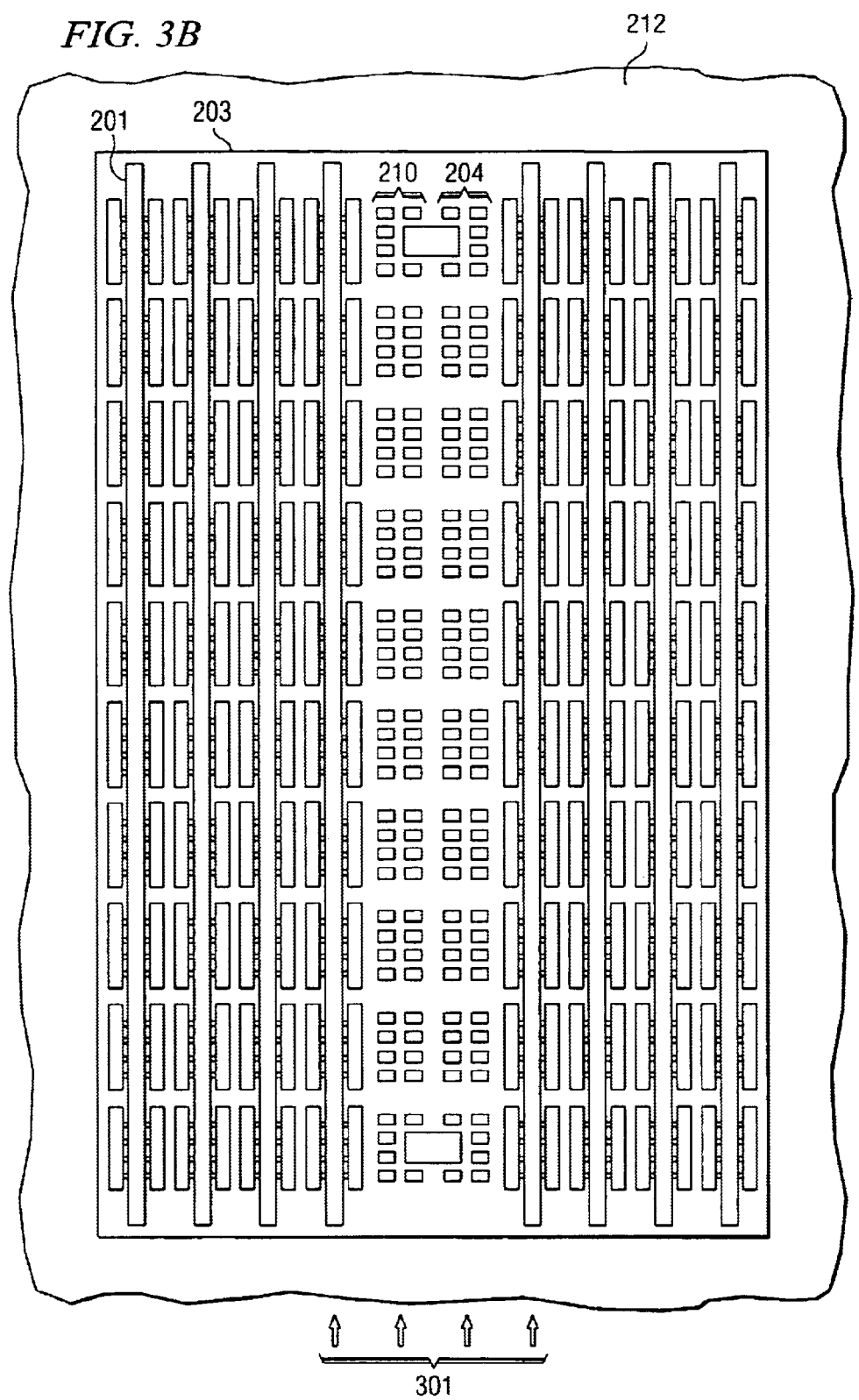

FIG. 3A depicts an example of an arrangement 300 of a portion of a computer system according to another embodiment of the invention. FIG. 3B depicts a top level view of the arrangement shown in FIG. 3A. The arrangement of FIG. 3A and 3B is similar to that of FIG. 2, except that in this embodiment the SMDs 204, 210 are located above the device 207. One aspect of SMDs 204, 210, is that they often have through-hole vias that are connected to particular planes, e.g. the power plane, of the memory board 203. SMDs that are terminators are typically connected to the ground plane. Since the vias are all the way through the memory board and the vias are typically filled with metal solder, the vias act as good thermal transfer paths for heat. Consequently, positioning the SMDs above the device 207 provides for a good thermal transfer path from the device 207, through the vias in the memory board 203, through a plane in the memory board (e.g. the ground plane), through the connectors 202 that are coupled to the plane, and then to the memory modules 201 that are connected to the connectors 202.

Signals that need to be routed to the memory modules 201-1 may be routed from the system board 212, to connector 209, to the memory board 203, and then to one or more memory modules 201-1, through one or more connectors 202-1. Similarly, signals that need to be routed to the memory modules 201-2 may be routed from the system board 212, to connector 205, to the memory board 203, and then to one or more memory modules 201-2, through one or more connectors 202-2. Similarly, signals routed from the memory modules 201-1 and/or 201-2 to the system board 212 would follow reverse paths.

Signals that are to be terminated using this arrangement from board 212 would be routed up through connector 209, to a destination in the memory modules 201-1, and be terminated at a SMD 204, 210. Another route for signals to be terminated for this arrangement from board 212 would be routed up through connector 205, to a destination in the memory modules 201-2, and be terminated at a SMD 204, 210. Note that other SMDs and/or terminators may be mounted on the system board 212.

In comparing the arrangement of FIG. 2 with that of FIGS. 3A and 3B. The arrangement of FIG. 2 may be easier to construct, since the SMDs are located above the connectors 205, 209, than the arrangement of FIGS. 3A and 3B. The arrangement of FIGS. 3A and 3B may be more efficient at transferring the heat from the device 207, since the SMDs are located above the device 207, rather than the arrangement of FIG. 2.

Figure 1:
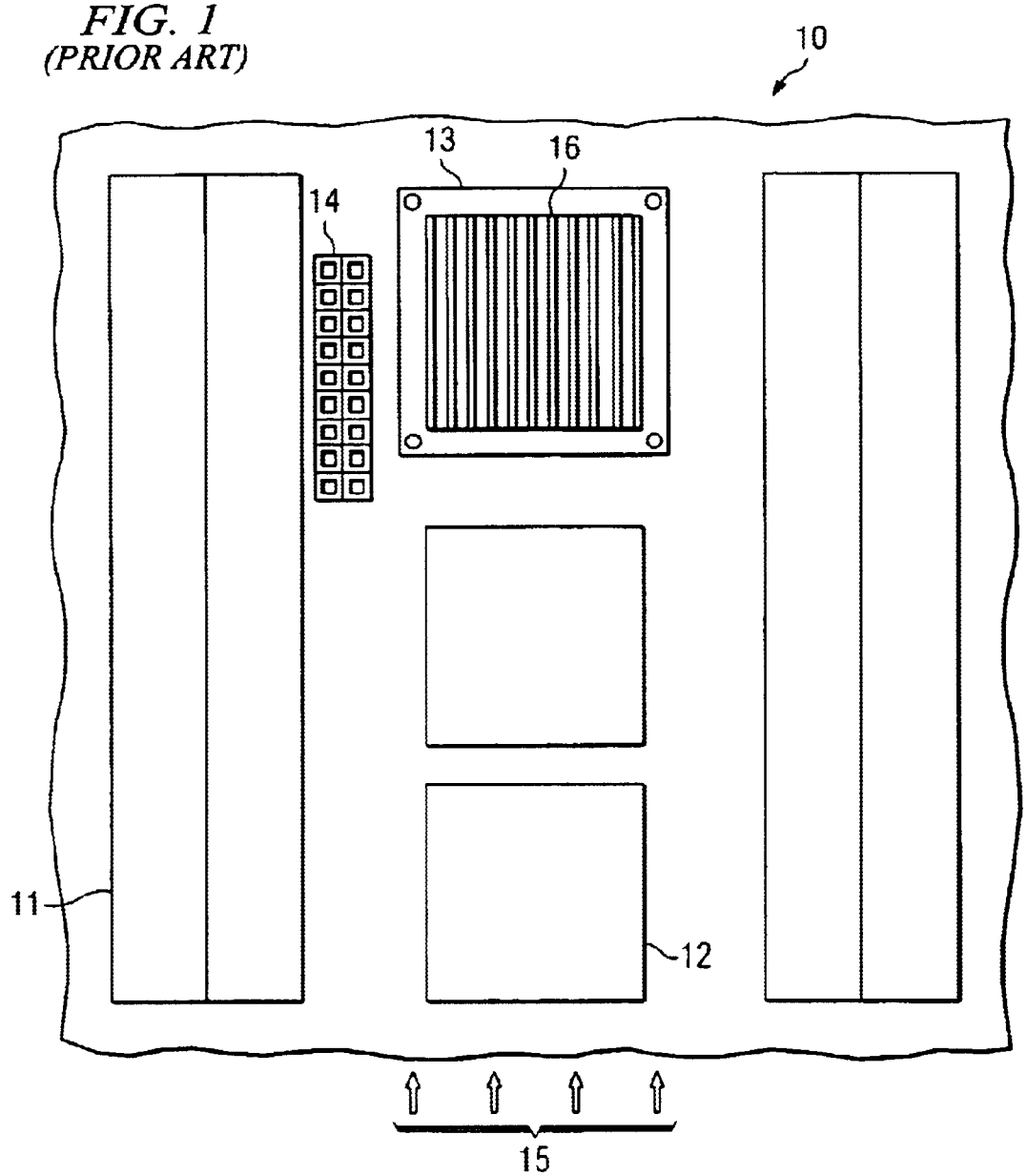
FIG. 1 depicts a prior art layout for a computer board.
Figure 6:
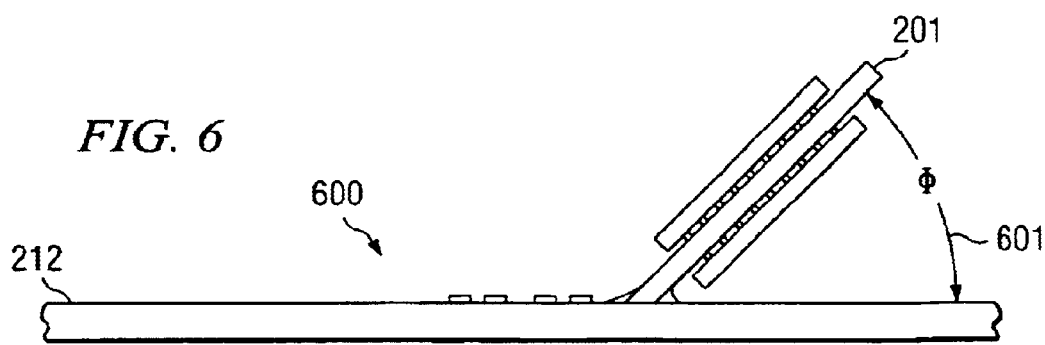
FIG. 6 depicts an example of an arrangement for using at least one component to cool at least one other component according to another embodiment of the invention.

The arrangements in both FIGS. 2, 3A and 3B reduce the area required for component usage on the system board 212 by moving components to a memory board 203, which is mounted onto the system board 212, thereby adding height to the computer system 200, 300. FIG. 4 depicts an example of an arrangement of a portion of computer system 400 according to another embodiment of the invention, whereby the height of the system 400 has been reduced as compared to the height of the systems 200, 300. In FIG. 4, the memory modules 201 are directly connected to the memory board 203, for example, by soldering the pins of the memory modules 201 to locations on the memory board 203. This reduces the height of the computer system 400 by eliminating the connectors 202. This arrangement also removes any unreliability associated with the connectors 202. The solder connections provide for good thermal transfer in addition to good electrical characteristics. Note that this arrangement may be used with either arrangement of the placement of the SMDs shown in FIGS. 2, 3A and 3B. Also, the height may be further reduced by attaching the memory modules at a non-orthogonal angle 601, e.g. a 45 degree angle, as shown in the arrangement 600 of FIG. 6.

The arrangement of FIG. 4 is more desirable in larger systems (e.g. 32 memory board systems, with each board having 8 memory modules, for a total of 256 memory modules, or more) where locating and replacing a faulty memory module is less important, and an entire memory board or even system board is more readily replaced. Thus, in larger systems, fault isolation only has to be determined to the memory board or system board level, and not the memory module level. In smaller systems (e.g. 1 memory board with 8 memory modules), it is more desirable to replace a faulty memory module than replace an entire board. Also in larger system, the higher numbers of connectors may lead to reliability issues with the connections of the connectors, thus, it is more desirable to eliminate the connectors as a cause of failure.

What is claimed is:

1. A system comprising:

a first component that generates heat; and a second component that is thermally connected to the first component;

a first board that supports the first component; and a second board that supports the second component and is thermally connected to the second component, and is connected to the first board;

wherein the heat from the first component is transferred to a coolant through the second component;

the second component has a function in the system associated with an operation of the system other than transferring heat; and a portion of the second board is thermally connected to the first component.

2. The system of claim 1, wherein the first component comprises a plurality of first components, each of which generates heat.

3. The system of claim 1, wherein the second component comprises a plurality of second components, each of which has an respective function in the system that is associated with a respective operation of the system.

4. The system of claim 1, wherein the second component comprises:

a cooling solution for transferring heat to the coolant.

5. The system of claim 1, wherein the system is a computer system and the second component is selected from the group consisting of:

a memory module, a dual-inline memory module, a single-inline memory module, a RAM memory module, a ROM memory module.

6. The system of claim 1, wherein the system is a computer system and the first component is selected from the group consisting of:

a processor, a memory controller, an I/O controller, a cache chip, a crossbar chip, and an integrated circuit device that generates more heat than that which can be transferred by a packaging of the device.

7. The system of claim 1, wherein the coolant is air.

8. The system of claim 1, wherein the second component operates as a heat sink fin for the at least one component.

9. The system of claim 1, wherein the second component is connected to one side of a the second board and the first component is connected to another side of the second board.

10. The system of claim 1, wherein the second board is removably attached to the first board.

11. The system of claim 1, wherein the first board and the connected second board are removably connected to the system.

12. The system of claim 1, further comprising:

a ball grid array that is used to connect the first component to the first board.

13. The system of claim 1, further comprising:

a conformal thermal transfer material that located between the second board and the first component.

14. The system of claim 1, further comprising:

at least one support that is located on the periphery of the first component and protects the first component from forces exerted on the second board.

15. The system of claim 1, further comprising:

at least one support that is located on the periphery of the first component and protects the first component from forces exerted on the second board;

wherein the at least one support surrounds the first component and is connected with the first board and the second board so as to form an electromagnetic interference shield that reduces interference between the first component and an environment external to the first component.

16. The system of claim 1, further comprising:

at least one support that is located on the periphery of the first component and protects the first component from forces exerted on the second board;

wherein the second component comprises a plurality of memory modules and the second board further comprises:

at least one memory module connector, each of which is associated with a memory module of the plurality of memory modules, and connects its associated memory module to the second board.

17. The system of claim 1, wherein the second component comprises a memory module, and the memory module is directly attached to the second board.

18. The system of claim 1, wherein the second component comprises a memory module, and the memory module is directly attached to the second board;

wherein the memory module is attached at a 45 degree angle with respect to a surface of the second board.

19. The system of claim 1, wherein the second component comprises a memory module, and the memory module is directly attached to the second board;

wherein the memory module is attached at a 90 degree angle with respect to a surface of the second board.

20. The system of claim 1, further comprising:

a plurality of devices that are attached to the second board;

wherein the plurality of devices are connected to vias in the second board, whereby the vias conduct heat from the at least one component to the at least one memory module.

21. The system of claim 1, further comprising:

a plurality of devices that are attached to the second board;

wherein the devices are bus terminators.

22. The system of claim 1, further comprising:

a plurality of devices that are attached to the second board;

wherein the plurality of devices are located with a first portion on one side of the second board and the first component is thermally connected to a second portion on the opposite side of the second board.

23. The system of claim 1, further comprising:

a plurality of devices that are attached to the second board;

wherein the plurality of devices are located with a first portion on one side of the second board and the first component is thermally connected to a second portion on the opposite side of the second board; and the first portion and the second portion are adjacent to each other.

24. The system of claim 1, further comprising:

a plurality of devices that are attached to the second board;

wherein the plurality of devices are located with a first portion on one side of the second board and the first component is thermally connected to a second portion on the opposite side of the second board; and the first portion is peripherally located on the second board with respect to one axis of the second board, and the second portion is centrally located on the second board with respect to the one axis.

* * * * *